United States Patent
Hwang et al.

(10) Patent No.: US 8,289,699 B2
(45) Date of Patent: Oct. 16, 2012

(54) HEAT DISSIPATION MODULE AND ELECTRONIC DEVICE HAVING THE SAME

(75) Inventors: Ching-Bai Hwang, Taipei Hsien (TW); Jui-Wen Hung, Taipei Hsien (TW)

(73) Assignee: Foxconn Technology Co., Ltd., Tu-Cheng, New Taipei (TW)

(*) Notice: Subject to any disclaimer, the term of this patent is extended or adjusted under 35 U.S.C. 154(b) by 207 days.

(21) Appl. No.: 12/910,856

(22) Filed: Oct. 24, 2010

(65) Prior Publication Data
US 2012/0069521 A1 Mar. 22, 2012

(30) Foreign Application Priority Data
Sep. 21, 2010 (TW) .............................. 99131900 A

(51) Int. Cl.
*H05K 7/20* (2006.01)

(52) U.S. Cl. .............. 361/679.47; 361/679.52; 361/695; 361/697; 361/700; 165/80.5; 165/104.21; 165/104.26; 165/185

(58) Field of Classification Search .............. 361/679.46–679.55, 688, 689, 361/690–697, 700–712, 715–724; 165/80.2, 165/80.3, 80.4, 80.5, 185, 104.21, 104.26, 165/104.33, 121–126; 454/184; 174/15.2, 174/16.3, 252

See application file for complete search history.

(56) References Cited

U.S. PATENT DOCUMENTS

| | | | |
|---|---|---|---|
| 6,621,698 B2* | 9/2003 | Chang | 361/679.47 |
| 7,212,404 B2* | 5/2007 | Wang et al | 361/697 |
| 7,339,787 B2* | 3/2008 | Cheng et al. | 361/695 |
| 7,345,874 B2* | 3/2008 | Cheng et al. | 361/695 |
| 7,447,030 B2* | 11/2008 | Hwang et al. | 361/700 |
| 7,518,861 B2* | 4/2009 | Lev et al. | 361/679.52 |
| 7,710,724 B2* | 5/2010 | Takeguchi et al. | 361/700 |
| 7,990,713 B2* | 8/2011 | Liu et al. | 361/700 |
| 2007/0131383 A1* | 6/2007 | Hattori et al. | 165/11.2 |
| 2007/0267172 A1* | 11/2007 | Hwang et al. | 165/80.3 |
| 2009/0135563 A1* | 5/2009 | Sakata | 361/697 |

* cited by examiner

*Primary Examiner* — Michail V Datskovskiy
(74) *Attorney, Agent, or Firm* — Altis Law Group, Inc.

(57) ABSTRACT

A heat dissipation module includes a centrifugal fan, a fin group, a first heat pipe and a second heat pipe. The centrifugal fan includes a housing and an impeller rotatably mounted in the housing. The housing defines an air inlet and an air outlet therein. The fin group is disposed at the air outlet of the centrifugal fan. The fin group includes a plurality of spaced fins. The first heat pipe includes a condensing section thermally contacting the fin group and an evaporating section for thermally contacting a heat source. The second heat pipe includes a condensing section thermally contacting the condensing section of the first heat pipe and an evaporating section for thermally contacting another heat source.

18 Claims, 3 Drawing Sheets

HEAT DISSIPATION MODULE AND ELECTRONIC DEVICE HAVING THE SAME

BACKGROUND

1. Technical Field

The disclosure generally relates to heat dissipation, and more particularly to a heat dissipation module which can dissipate heat from two or more electronic components.

2. Description of Related Art

With the continuing development of electronics technology, processors, memory cards, etc. of electronic devices such as notebook computers have become faster, which causes the processors to generate more redundant heat. Heat dissipation apparatuses are traditionally disposed in the electronic devices to help transfer the heat from the processor to the outside of the electronic device. Thus a normal, stable operating temperature of the processor is maintained.

Generally, the heat dissipation apparatus is rather bulky and tall. When there are two or more processors needing cooling, it is often impractical to install a corresponding number of large heat dissipation apparatuses onto the processors. This is because the space between the processors and the housing of the electronic device is usually limited, and/or the heat dissipation apparatuses may interfere with other components of the electronic device. If there is a processor without adequate heat dissipation, the operation of the processor and indeed the electronic device itself may be unstable.

It is thus desirable to provide a heat dissipation means which can overcome the described limitations.

DETAILED DESCRIPTION

Figure 1:
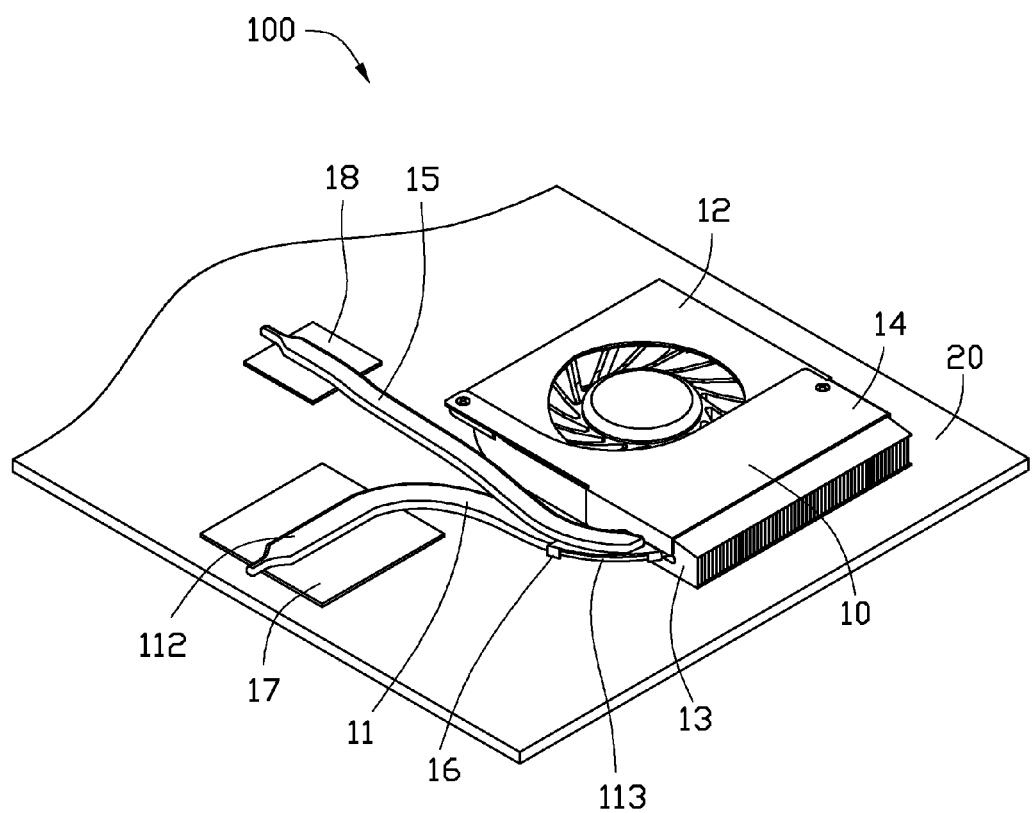
FIG. 1 is an assembled view of an electronic device of an embodiment of the present disclosure.
Figure 2:
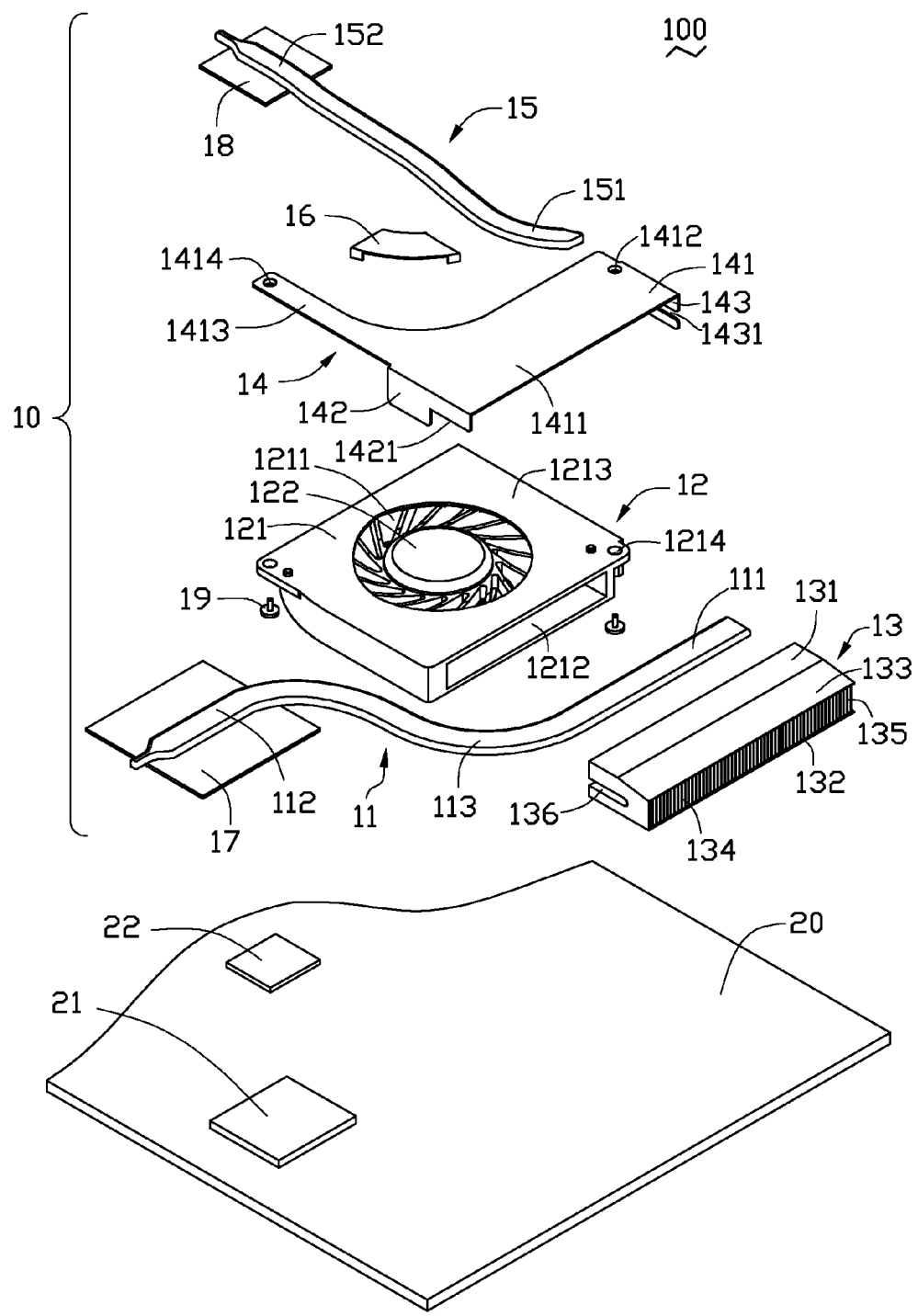
FIG. 2 is an exploded view of the electronic device of FIG. 1.

Referring to FIGS. 1-2, an electronic device 100 of the disclosure is shown. The electronic device 100 includes a printed circuit board 20, a first electronic component 21 and a second electronic component 22 mounted on the printed circuit board 20, and a heat dissipation module 10 thermally contacting the first and second electronic components 21, 22 to dissipate heat therefrom.

The heat dissipation module 10 includes a first heat pipe 11, a centrifugal fan 12, a fin group 13, a fan duct 14 connecting the centrifugal fan 12 with the fin group 13, a second heat pipe 15 adhered to the first heat pipe 11, a connecter 16 between the first and second heat pipes 11, 15, and two heat absorbing plates 17, 18 connecting the first and second heat pipes 11, 15, respectively. Each heat absorbing plate 17, 18 is a rectangular copper sheet thermally contacting the first electronic component 21 and the second electronic component 22, respectively.

The first heat pipe 11 is flat and includes an elongated condensing section 111, an elongated evaporating section 112, and a generally S-shaped connecting section 113 adjoining the condensing section 111 and the evaporating section 112. The condensing section 111 and the evaporating section 112 extend from two opposite ends of the connecting section 113, and are located generally at two opposite sides of the connecting section 113. The condensing section 111 extends through the fin group 13. The evaporating section 112 thermally contacts the heat absorbing plate 17.

The centrifugal fan 12 includes a housing 121, and an impeller 122 rotatably mounted in the housing 121. The housing 121 includes a rectangular top plate 1213. Two diagonally opposite corners of the top plate 1213 define two threaded holes 1214, respectively, to receive two fasteners 19. The housing 121 defines an air inlet 1211 in the top plate 1231 thereof, and an air outlet 1212 in a lateral side thereof.

The fin group 13 is disposed at the air outlet 1212 of the centrifugal fan 12 and spaced therefrom. The fin group 13 includes an elongated top plate 131, an elongated extending plate 133 obliquely angling slightly downwardly from a front edge of the top plate 131, an elongated bottom plate 132 below the top plate 131 and the extending plate 133, and a plurality of spaced fins 134. The top plate 131 and the bottom plate 132 are parallel. The extending plate 133 is gently sloped from the top plate 131 generally towards the bottom plate 132. A length along a transverse axis of the fin group 13 cooperatively defined by the top plate 131 and the extending plate 133 is equal to that of the bottom plate 132. The fins 134 are parallel, being located between the bottom plate 132, the top plate 131 and the extending plate 133 and adjoining the bottom plate 132, the top plate 131 and the extending plate 133. An air channel 135 is defined between every two adjacent fins 134. A U-shaped, elongated groove 136 is defined at a central portion of the fin group 13 along a longitudinal axis of the fin group 13. The groove 136 runs through opposite ends of the fin group 13. The groove 136 is located at a rear side of the fin group 13, and is shorter than condensing section 111 of the first heat pipe 11. A middle portion of the condensing section 111 is received in the groove 136.

The fan duct 14 includes a guiding portion 141, and a first side plate 142 and a second side plate 143 respectively depending from opposite ends of the guiding portion 141.

The guiding portion 141 is an L-shaped sheet, and includes a rectangular guiding plate 1411 and an elongated connecting plate 1413 extending from a lateral side of a top end of the guiding plate 1411. The first and second side plates 142, 143 depend from lateral ends of the guiding plate 1411, respectively. The guiding plate 1411 is greater than or equal in length to the housing 121 of the centrifugal fan 12, and greater than or equal in length to the fin group 13. Therefore, the housing 121 and the fin group 13 are located between the first and second side plates 142, 143 when the fin group 13, the centrifugal fan 12 and the fan duct 14 are assembled. A corner of the guiding plate 1411 defines a through hole 1412 therein. A top end of the connecting plate 1413 defines a through hole 1414 therein. The through holes 1412, 1414 are aligned with the threaded holes 1214 of the top plate 1213 of the housing 121 of the centrifugal fan 12, respectively, and receive the fasteners 19. Thus, the fan duct 14 is assembled on the centrifugal fan 12.

The first side plate 142 is an L-shaped sheet with a rectangular cutout 1412 at a front side of a bottom end thereof. The second side plate 143 is rectangular. A U-shaped slit 1431 is defined along a longitudinal direction of the second side plate 143, from a rear end of the second side plate 143 toward a front end of the second side plate 143. The cutout 1412 is aligned with the slit 1431 to allow the condensing section 111 of the first heat pipe 11 to extend therethrough.

When the fan duct 14 is assembled on the centrifugal fan 12, the guiding plate 1411 exceeds the air outlet 1212 of the centrifugal fan 12 and the first and second side plates 142, 143 are located outside and abut opposite lateral sides of the housing 121 of the centrifugal fan 12.

When the fin group 13 is assembled to the fan duct 14, a rear end of the fin group 13 is enclosed by the fan duct 14 and the opposite ends of the groove 136 of the fin group 13 are aligned with the cutout 1421 and the slit 1431 of the first and second side plates 142, 143, respectively. The condensing section 111 of the first heat pipe 11 extends through the cutout 1421 into the groove 136 and the slit 1431 and is secured therein. The fin group 13, assembled on the fan duct 14 at this point, faces the air outlet 1212 of the centrifugal fan 12 and is spaced therefrom. The extending plate 133 of the fin group 13 is outside of the fan duct 14. The connecting section 113 and the evaporating section 112 of the first heat pipe 11 are located at lateral sides of the centrifugal fan 12 (see FIG. 1). The fan duct 14 guides airflow to the fin group 13.

Figure 3:
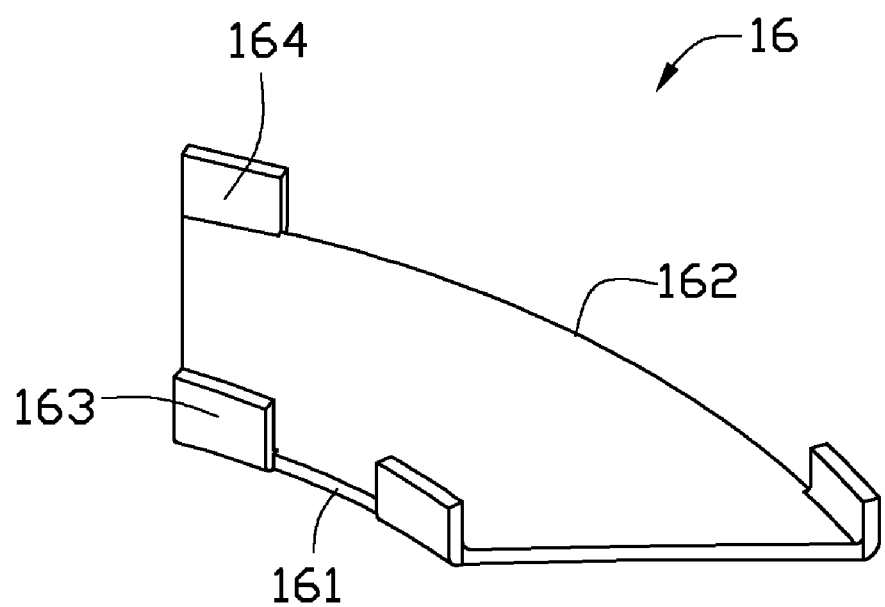
FIG. 3 is an enlarged, isometric view of a connecter of the electronic device of FIG. 2 when the connecter is inverted.

Referring also to FIGS. 2-3, the connecter 16 is generally in the form of a metallic sheet, and is made of material having good heat conductivity. In this embodiment, the connecter 16 is generally a copper sheet, which is located between the first and second heat pipes 11, 15. Thereby, the force of any impact occurring between the first and second heat pipes 11, 15 during assembly can be reduced. The connecter 16 is trapezoidal. In particular, the connecter 16 has the shape of a truncated sector, including an outer first side 161 and an opposite inner second side 162. The first side 161 and the second side 162 are curved and substantially parallel to each other. Two spaced first arms 163 extend from opposite ends of the first side 161. Two spaced second arms 164 extend from opposite ends of the second side 162. The connecter 16 abuts the connecting section 113 of the first heat pipe 11. The first arms 163 and the second arms 164 span the connecting section 113 and abut lateral sides of the connecting section 113 to secure the connecter 16 on the connecting section 113. Preferably, thermal grease (not shown) is disposed between the connecter 16 and the connecting section 113 to decrease thermal resistance between the connecter 16 and the connecting section 113. The connecter 16 is located at an outside of the fan duct 14.

The second heat pipe 15 is flat, and includes a condensing section 151 and an evaporating section 152 extending downwardly and outwardly from an end of the condensing section 151. The condensing section 151 is adhered to a top surface of the connecter 16. The evaporating section 152 is spaced from the first heat pipe 11, and an outmost end of the evaporating section 152 thermally contacts the second heat absorbing plate 18.

When the electronic device 100 is completely assembled, a combined height of the condensing section 111 of the first heat pipe 11 adjacent to the side of the fin group 13 and the condensing section 151 of the second heat pipe 15 adjacent to the side of the fin group is less than or equal to the height of the fin group 13. The topmost extremities of the first and second heat pipes 11, 15 are located below the topmost extremity of the fin group 13.

When the electronic device 100 operates, heat generated by the first electronic component 21 is absorbed by the heat absorbing plate 17 and transferred to the fin group 13 by the first heat pipe 11. Heat generated by the second electronic component 22 is absorbed by the heat absorbing plate 18 and immediately transferred to the connecter 16 by the second heat pipe 15. Heat absorbed by the connecter 16 is transferred to the condensing section 111 of the first heat pipe 11 and finally transferred to the fin group 13 by the condensing section 111. Air outside of the housing 121 of the centrifugal fan 12 is drawn into the centrifugal fan 12 from the air inlet 1211, and airflow expelled from the air outlet 1212 proceeds towards the fin group 13 to evacuate heat from the fin group 13 to the exterior of the electronic device 100.

In the electronic device 100, due to the first heat pipe 11 and the second heat pipe 15 of the heat dissipation module 10 thermally contacting the first and second electronic components 21, 22 closely, only the single heat dissipation module 10 is needed. This is advantageous compared to the above-described conventional electronic device which requires one heat dissipation apparatus per processor. The heat dissipation module 10 can dissipate heat from two or more electronic components. In addition, the condensing section 151 of the second heat pipe 15 is stacked on the connecting section 113 of the first heat pipe 11 at an outside of the fin group 13. Therefore a height (thickness) of the fin group 13 is not added to, and the fin group 13 can avoid interfering with other components of the electronic device 100. Thus, the stability of the first and second electronic components 21, 22 is improved, and the operation and reliability of the electronic device 100 are good.

It is to be understood, however, that even though numerous characteristics and advantages of certain embodiments have been set forth in the foregoing description, together with details of the structures and functions of the embodiments, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. A heat dissipation module comprising:
   a centrifugal fan comprising a housing and an impeller rotatably mounted in the housing, the housing defining an air inlet and an air outlet;
   a fin group disposed at the air outlet of the centrifugal fan, the fin group comprising a plurality of spaced fins;
   a first heat pipe comprising a condensing section thermally contacting the fin group and an evaporating section for thermally contacting a heat source; and
   a second heat pipe comprising a condensing section thermally contacting the condensing section of the first heat pipe and an evaporating section for thermally contacting another heat source;
   wherein the condensing section of the second heat pipe is mounted on the condensing section of the first heat pipe at an outside of the fin group.

2. The heat dissipation module of claim 1, further comprising a connecter located between and thermally interconnecting the condensing sections of the first and second heat pipes.

3. The heat dissipation module of claim 2, wherein the connecter comprises a plurality of arms, the connecter contacts the first heat pipe and the arms span the first heat pipe and abut opposite sides of the first heat pipe, and the condensing section of the second heat pipe is adhered to the connecter.

4. The heat dissipation module of claim 1, further comprising a fan duct mounted on the housing of the centrifugal fan and enclosing a part of the fin group therein.

5. The heat dissipation module of claim 4, wherein the fan duct comprises a guiding portion secured on the centrifugal fan and a first and a second side plate extending from opposite sides of the guiding portion, the guiding portion, wherein the first side plate and the second side plate exceed the centrifugal fan in size and enclose an end of the fin group to guide airflow generated by the centrifugal fan towards the fin group.

6. The heat dissipation module of claim 4, wherein the fin group further comprises a top plate, an extending plate angling from a side of the top plate, and a bottom plate below the top plate and the extending plate, wherein the fins connect the top plate, extending plate and the bottom plate, the top plate and a part of the bottom plate are enclosed by the fan duct, and the extending plate is located outside of the fan duct and oriented towards the bottom plate.

7. The heat dissipation module of claim 6, wherein the condensing section of the first heat pipe extends through the first and second side plates of the fan duct and the fin group.

8. The heat dissipation module of claim 1, wherein the evaporating sections of the first and second heat pipes are spaced from each other.

9. The heat dissipation module of claim 1, further comprising two heat absorbing plates contacting the evaporating sections of the first and second heat pipes respectively.

10. An electronic device comprising:
a circuit board comprising a first electronic component and a second electronic component; and
a heat dissipation module thermally contacting the first and second electronic components, the heat dissipation module comprising:
a centrifugal fan comprising a housing and an impeller rotatably mounted in the housing, the housing defining an air inlet and an air outlet;
a fin group disposed at the air outlet of the centrifugal fan, the fin group comprising a plurality of spaced fins;
a first heat pipe comprising a condensing section thermally contacting the fin group and an evaporating section thermally contacting the first electronic component;
a second heat pipe comprising a condensing section thermally contacting the condensing section of the first heat pipe and an evaporating section thermally contacting the second electronic component; and
a connecter located between and thermally interconnecting the condensing sections of the first and second heat pipes.

11. The electronic device of claim 10, wherein the condensing section of the second heat pipe is mounted on the condensing section of the first heat pipe at an outside of the fin group.

12. The electronic device of claim 10, further comprising a fan duct mounted on the housing of the centrifugal fan and enclosing a part of the fin group therein.

13. The electronic device of claim 10, wherein the fin group further comprises a top plate, an extending plate angling from a side of the top plate, and a bottom plate below the top plate and the extending plate, wherein the fins connect the top plate, extending plate and the bottom plate, the top plate and a part of the bottom plate are enclosed by the fan duct, and the extending plate is outside of the fan duct and oriented towards the bottom plate.

14. The electronic device of claim 10, wherein the condensing section of the first heat pipe extends through the fin group.

15. The electronic device of claim 10, further comprising two heat absorbing plate contacting the evaporating sections of the first and second heat pipes respectively.

16. An electronic device comprising:
a circuit board comprising a first electronic component and a second electronic component; and
a heat dissipation module thermally contacting the first and second electronic components, the heat dissipation module comprising:
a centrifugal fan comprising a housing and an impeller rotatably mounted in the housing, the housing defining an air inlet and an air outlet;
a fin group disposed at the air outlet of the centrifugal fan, the fin group comprising a plurality of spaced fins;
a first heat pipe comprising a condensing section thermally contacting the fin group and an evaporating section thermally contacting the first electronic component, wherein the condensing section of the first heat pipe connects with the fin group via a side of the fin group and does not add to a height of the fin group; and
a second heat pipe comprising a condensing section thermally contacting the condensing section of the first heat pipe adjacent to the side of the fin group and an evaporating section thermally contacting the second electronic component;
wherein a combined height of the condensing section of the first heat pipe adjacent to the side of the fin group and the condensing section of the second heat pipe adjacent to the side of the fin group is less than or equal to the height of the fin group.

17. The electronic device of claim 16, wherein topmost extremities of the first and second heat pipes are located below a topmost extremity of the fin group.

18. The electronic device of claim 17, further comprising a connecter located between and thermally interconnecting the condensing sections of the first and second heat pipes.

* * * * *